US012793936B2

(12) United States Patent
Sharang et al.

(10) Patent No.: US 12,793,936 B2
(45) Date of Patent: Nov. 10, 2026

(54) METHOD OF AUTOMATIC DETECTION OF REQUIRED PEAK FOR SAMPLE MACHINING BY FOCUSED ION BEAM

(71) Applicant: Tescan Group A.S., Brno (CZ)

(72) Inventors: Sharang Sharang, Delhi (IN); Hedvika Vocilkova, Kostelni Radoun (CZ)

(73) Assignee: Tescan Group A.S., Brno (CZ)

(*) Notice: Subject to any disclaimer, the term of this patent is extended or adjusted under 35 U.S.C. 154(b) by 996 days.

(21) Appl. No.: 18/000,745

(22) PCT Filed: Jun. 2, 2021

(86) PCT No.: PCT/CZ2021/050058
§ 371 (c)(1),
(2) Date: Dec. 5, 2022

(87) PCT Pub. No.: WO2021/244685
PCT Pub. Date: Dec. 9, 2021

(65) Prior Publication Data

US 2023/0215689 A1 Jul. 6, 2023

(30) Foreign Application Priority Data

Jun. 5, 2020 (CS) ................................ PV 2020-320

(51) Int. Cl.
*H01J 37/304* (2006.01)
*H01J 37/305* (2006.01)

(52) U.S. Cl.
CPC ........ *H01J 37/304* (2013.01); *H01J 37/3053* (2013.01); *H01J 2237/30466* (2013.01)

(58) Field of Classification Search
CPC ........... H01J 2237/30466; H01J 37/304; H01J 37/3053; H01J 37/3056; H01J 37/3171; H01J 2237/24542
See application file for complete search history.

(56) References Cited

U.S. PATENT DOCUMENTS

| | | | | |
|---|---|---|---|---|
| 5,952,658 | A * | 9/1999 | Shimase | H01J 37/3056 250/492.21 |
| 2004/0241890 | A1* | 12/2004 | Steele | G01N 27/002 438/14 |
| 2004/0256573 | A1* | 12/2004 | Mollica | H01J 37/304 250/492.1 |

FOREIGN PATENT DOCUMENTS

| | | |
|---|---|---|
| JP | 2000036278 A | 2/2000 |

OTHER PUBLICATIONS

European Patent Office, International Searching Authority, International Search Report, dated Oct. 1, 2021, in International Application No. PCT/CZ2021/050058, filing date Jun. 2, 2021.

(Continued)

*Primary Examiner* — Woody A Lee, Jr.
*Assistant Examiner* — Abigail H Rhue
(74) *Attorney, Agent, or Firm* — Thedford I. Hitaffer; Hitaffer, PLLC

(57) ABSTRACT

A method of automatic detection of a required peak for sample machining by a focused ion beam uses for a filtration of a measured signal of secondary particles of a discrete wavelet transformation followed by a peak detection, and stops sample machining after the required a number of peaks has been reached.

10 Claims, 2 Drawing Sheets

(56) References Cited

OTHER PUBLICATIONS

European Patent Office, International Searching Authority, International Written Opinion, dated Oct. 1, 2021, in International Application No. PCT/CZ2021/050058, filing date Jun. 2, 2021.
Harriott L R et al: "Focused Ion Beam Secondary Ion Mass Spectrometry: IonImages and End-Point Detection", Journal of Vacuum Science and Technology:Part B, AVS / AIP, Melville, New York, NY,US, vol. 7, No. 2, Mar. 1, 1989, pp. 181-187, XP000007159, ISSN: 1071-1023, DOI: 10.1116/1.584712, Figure 6.

* cited by examiner

METHOD OF AUTOMATIC DETECTION OF REQUIRED PEAK FOR SAMPLE MACHINING BY FOCUSED ION BEAM

CROSS-REFERENCE TO RELATED APPLICATIONS

This application, filed under 35 USC 371, is a United States National Stage Application of International Application No. PCT/CZ2021/050058 filed Jun. 2, 2021, which claims priority to Czech Applicaitron No. PV 2020-320 filed Jun. 5, 2020, the disclosures of which are incorporated herein by reference in their entirety.

FIELD OF THE INVENTION

The invention is related to a method of automatic detection of a required peak for sample machining by a focused ion beam. It is particularly related to automatic detection of required milled sample layer of multilayer materials, particularly of multilayer semiconductor chips or printed circuit boards.

BACKGROUND OF THE INVENTION

Nowadays, focused ion beam (FIB) has been increasingly used for machining of various multilayer materials, particularly in semiconductor industry. The aim of such machining can be, for example, an analysis of defects on a printed circuit board (PCB), production of PCB prototypes, PCB repair, analysis of defects of multilayer semiconductor chips, production of multilayer semiconductor chip prototypes, or repair of multilayer semiconductor chips. In order to allow such machining, it is usually necessary to know the depth of machining, and particularly it is necessary to detect an endpoint at transition between individual layers during machining of complex structures. Various methods of such detection have already been introduced with regards to this requirement, such as a detection of a current received by sample or detection of various signal particles, such as secondary particles, e.g., secondary ions or secondary electrons. A drawback of the secondary particle detection is their wide range of energy values which depends in particular on the material from which they are emitted.

One of patents disclosing a use of secondary particles is U.S. Pat. No. 5,952,658. This patent discloses detecting secondary particles generated by impinging of a beam of charged particles, using the effect of different production of these particles depending on the layer material. Subsequently, based on the detected signal, peaks which correspond to given materials which are impinged by the beam of charged particles in the given moment are determined. Afterwards, based on these peaks, the required endpoint is determined. When detecting a signal, noise is often detected, which hinders the correct identification of peaks in the signal, and therefore it is essential to suppress the noise in a suitable way as much as possible. The patent thus further discloses a method for filtering the detected signal. To suppress the noise, the detected signal is first cumulated and then averaged by means of an averaging filter with a floating window, and then approximated by a polynomial. A drawback of the described signal filtration method is a necessity to modify the said polynomial depending on the amount of signal, which reduces robustness of the whole process. Another drawback is the use of the averaging filter with floating window as the first step of signal processing since the use of this type of filter in this point of signal processing is insufficiently effective and the noise is not effectively suppressed.

Another document that discloses the use of secondary electrons is a patent application JP2000036278. This patent application discloses detection of secondary electrons generated by a focused ion beam impinging the sample. In contrast to the above-mentioned American patent, this application discloses a comparison of detected signal without further modifications thereof with a reference signal. Based on the result of this comparison, a command is then issued to stop the sample machining by the focused ion beam. However, this type of machining is not suitable, since it is necessary to know the reference signal in advance, which is very complicated due to possible ranges of secondary electron energies.

All the above-mentioned documents thus represent solutions which are not robust and their use in an arbitrary case is very complicated or even impossible.

Therefore, it would be desirable to introduce a robust solution that would allow for processing of secondary particles which would not depend on previous knowledge of a reference signal or would not require modifications of filters and would allow for detecting the machining endpoint and significantly reducing noise under any conditions.

SUMMARY OF THE INVENTION

The above-mentioned goal is achieved by a method of automatic detection of required peak for sample machining by a focused ion beam by a system comprising an ion column with an ion source arranged for irradiating the sample with a focused ion beam, a working chamber to which the ion column is connected, a detector of secondary particles which is located in the working chamber or in the ion column, a sample holder located in the working chamber and arranged for accommodating the sample, a sample located in the sample holder, and an evaluation unit comprising a memory which stores at least information on the required number of peaks, comprising a first group of steps comprising a step of:

- irradiating individual machined spots in the machined area of the sample by the focused ion beam and detecting a quantity of secondary particles emitted from the machined sample area, and storing discrete values obtained by averaging the detected quantity of secondary particles from the whole machined area with the sampling frequency in the range of 1 to 3 Hz to the memory, and the subject matter of which is based on the fact that it further comprises a second group of steps performed simultaneously with the first group of steps, wherein the second group of steps is performed by the evaluation unit, and wherein the second group of steps comprises a sequence of steps of:

- transforming the stored discrete values according to the frequencies at least to a part with high frequencies and to a part with remaining frequencies by performing at least one-level discrete wavelet transformation of the stored discrete values according to decomposition filters of the mother wavelet
- resetting the part of the transformed discrete values with high frequencies
- creating a filtered signal by performing inverse discrete wavelet transformation of the transformed discrete values according to reconstruction filters of the mother wavelet detecting the number of filtered signal peaks issuing a command to stop sample machining by a focused ion beam after reaching a given number of peaks according to the information on the required number of peaks.

The method of automatic detection of required peak for sample machining by the focused ion beam achieves the above-mentioned goal by using discrete wavelet transformation for signal filtration, which allows to filter out noise from the measured values without necessity to set and know the threshold values. Since the knowledge of threshold values to perform filtration is not necessary, it is possible to effectively filter any signal.

In another variant of the step of transforming the stored discrete values, the stored discrete values are transformed at least to a part with high frequencies, to a part with medium high frequencies, to a part with medium low frequencies, and to a part with low frequencies by performing four-level discrete wavelet transformation of the stored discrete values based on decomposition filters of the mother wavelet. This variant of the step of transforming the stored discrete values helps to achieve the above-mentioned goals by, in case of a noisy signal, allowing to filter away a large amount of noisy signal in comparison to just one-level discrete wavelet transformation. A noisy signal is considered a signal which contains higher number of peaks than the required number of peaks or a signal with ratio noise to signal higher than 15%.

In another variant of the step of resetting the part of transformed discrete values, the parts of transformed discrete values with high frequencies, with medium high frequencies, and with medium low frequencies are reset. This variant of the step of resetting the part of transformed discrete values in connection with the variant of the step of transforming the stored discrete values described in the previous paragraph helps to achieve the above-mentioned goals, since in case of a noisy signal, it filters away a large amount of noisy signal from the signal in comparison to the state when just a part of transformed discrete values with high frequencies is filtered away from the signal.

In another variant of the second group of steps, after the step of creating a filtered signal and before the step of detecting the number of peaks, a step of averaging the filtered signal with the use of a floating window and by averaging the magnitude of values of the filtered signal located in this floating window is further performed by the evaluating unit. Using the step of averaging the filtered signal after the previous steps allows to smooth the already filtered signal even more, thus subsequently facilitating peak detection and achieving the above-mentioned goals. The floating window length corresponds to 3 to 15% of the current number of detected discrete values. However, the maximum floating window length corresponds to the maximum number of 100 discrete values, or equivalent length of a time period based on the sampling frequency.

In another variant of the second group of steps, after the step of detecting the number of peaks and before the step of issuing a command to stop sample machining, a step of skipping close peaks, wherein close peaks are the peaks with the distance from the closest peak smaller than 50% of the average distance value between the individual consecutive peaks, is further performed by the evaluating unit. Using the step of skipping close peaks helps to achieve the above-mentioned goals by removing the peaks which are too close to the preceding and following peaks, and it is therefore likely that this is a false peak not identifying a different layer, but just a measurement error. Such false peak is, for example, a small excess of a subsequent value of the filtered signal during otherwise decreasing trend.

In another variant of the second group of steps, after the step of detecting the number of peaks of the filtered signal and before the step of issuing a command to stop sample machining by a focused ion beam, a step of skipping the last peak is performed by the evaluating unit. Using the step of skipping the last peak helps to reach the above-mentioned goals by removing the last false peak generated due to the borderline phenomenon of the noisy signal. The borderline phenomenon is generated during averaging of the filtered signal with the use of a floating window.

Peaks are local maxima of the filtered signal or local minima of the filtered signal.

According one of the variants, the mother wavelet is Daubechies-4. Using this mother wavelet allows for reliable detection of changes of the gradient of stored discrete values in comparison with other types of mother wavelets, e.g., Haar wavelet.

DESCRIPTION OF DRAWINGS

The subject matter of the invention is described by way of exemplary embodiments thereof, which are described by means of accompanying drawings, in which.

EXEMPLARY EMBODIMENTS OF THE INVENTION

Figure 1:
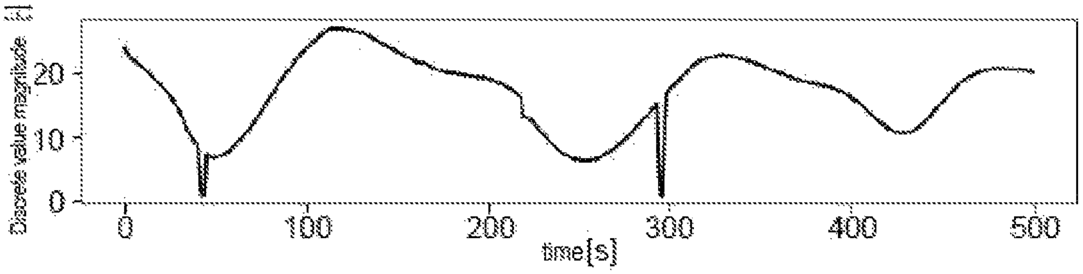
FIG. 1 shows a graph showing the magnitude of stored discrete values of the first specific exemplary embodiment in relation to time.

The described embodiments represent exemplary embodiments of the invention, which, however, have no limiting effect in terms of scope of protection.

An exemplary embodiment of the invention is a method of automatic detection of a required peak for sample machining by a focused ion beam by means of a system. The system comprises an ion column with an ion source. The ion column with the ion source is arranged for irradiating the sample by a focused ion beam. The ion column is arranged for irradiating the sample by the focused ion beam in such way that it comprises an ion source, an extractor, a condenser lens, and a deflector. These are located in the ion column such that the extractor is located behind the ion source along the ion column optical axis in the direction of the ion beam propagation. The condenser lens is located behind the extractor along the ion column optical axis in the direction of the ion beam propagation. The deflector is located behind the condenser lens along the ion column optical axis in the direction of the ion beam propagation. Behind the deflector along the ion column optical axis in the direction of the ion beam propagation the opening of the ion column is located, through which the focused ion beam emerges from the ion column. The ion beam is focused during its passage through the condenser lens. The deflector deflects the ion beam in two mutually perpendicular directions perpendicular to the direction of the ion beam propagation. In one of the exemplary embodiments the deflector can be composed of two levels of scanning elements, wherein they are arranged for applying a force field on the ion beam, which is, based on this effect, deflected relative to the ion column optical axis. The deflector can be composed of electromagnetic coils or electrostatic electrodes.

The system further comprises a working chamber to which an ion column is connected. The ion column is connected to the working chamber in such way that the focused ion beam emerging from the opening of the ion column enters the working chamber. The system further comprises a sample holder and a sample. The sample holder is arranged for accommodating the sample. The sample is located in the sample holder. The sample holder is located in the working chamber. In the first exemplary embodiment of the sample holder, the sample holder is arranged for tilting around three mutually perpendicular axes and arranged for movement along three mutually perpendicular axes. In the second exemplary embodiment of the sample holder, the sample holder is arranged for tilting around at least a single axis.

In one of the exemplary embodiments, the system further comprises a gas reservoir and an assembly for supplying gas into the working chamber, connected on one end to the working chamber and on the other end to the gas reservoir. The supplied gas is any gas from the Nanoflat group by TESCAN ORSAY HOLDING a.s., A-Maze by TESCAN ORSAY HOLDING a.s., $XeF_2$ or any other suitable gas supporting acceleration of etching by the focused ion beam, reduction of undesirable doping from the focused ion beam on the sample, reduction of redeposition of the etched material, or reduction of selectiveness for multilayer samples.

The system further comprises a detector of secondary particles. Secondary particles are secondary electrons or secondary ions emitted by the sample after the focused ion beam impinges the sample. In the first exemplary embodiment of the secondary particle detector location, the detector of secondary particles is located in the working chamber. In the second exemplary embodiment of the secondary particle detector location, the detector of secondary particles is located in the ion column. The detector of secondary particles detects the amount of secondary particles emitted from the machined sample area. The detected values of the amount of secondary particles from the detector of secondary particles from the whole machined sample area are, with the use of, for example, an integrated system (also called embedded system) or another computing system, with the sampling frequency in the range of 1 to 3 Hz, averaged such that a single discrete value arises from the whole machined area in regular intervals given by the said sampling frequency. Subsequently, these discrete values are stored in a memory in the form of dependency of magnitude of discrete values on time, based on the sampling frequency or a number of discrete values.

The system further comprises an evaluation unit and a control unit. The evaluation unit comprises a memory and a processor. The evaluation unit and the control unit are any devices from the group of at least a personal computer, a microcomputer, or an integrated system. The evaluation unit is data-connected to the detector of secondary particles and to the control unit. The control unit is arranged for controlling the sample irradiation by the focused ion beam. The control unit is data-connected to the control elements of the ion source, the extractor, the deflector, and the condenser lens. Data connection is an analog or digital connection. The evaluation unit is arranged for issuing a command to stop sample machining by the focused ion beam. The command to stop sample machining by the focused ion beam is sent to the control unit, which, consequently, stops sample machining by the focused ion beam. The memory stores the information on the required number of peaks and the nature of peaks, i.e., whether these peaks should be local maxima, local minima or combinations of both. Local maxima, or local minima, respectively, are considered such signal values which contribute to a change from increasing signal trend to decreasing signal trend, or vice versa.

The method of automatic detection of required peak for sample machining by a focused ion beam comprises a first group of steps and a second group of steps, which are performed simultaneously.

The first group of steps comprises a step of irradiating individual sample spots by the focused ion beam and detecting a quantity of secondary particles emitted from the machined sample area which is impinged by the focused ion beam and storing the discrete values in the memory. The first group of steps further comprises a step of stopping the irradiation of individual machined sample spots by the focused ion beam after the control unit has received a command to stop sample machining by the focused ion beam from the evaluation unit.

In the first exemplary embodiment of the second group of steps, the second group of steps comprises a sequence of steps performed by the evaluation unit comprising steps of: transforming stored discrete values, resetting discrete values, creating filtered signal, detecting number of peaks, issuing command to stop sample machining.

In the second exemplary embodiment of the second group of steps, the second group of steps comprises a sequence of steps performed by the evaluation unit comprising steps of: transforming stored discrete values, resetting part of transformed discrete values, creating filtered signal, averaging of filtered signal, detecting number of peaks, issuing command to stop sample machining.

In the third exemplary embodiment of the second group of steps, the second group of steps comprises a sequence of steps performed by the evaluation unit comprising steps of: transforming stored discrete values, resetting part of transformed discrete values, creating filtered signal, detecting number of peaks, skipping close peaks, issuing command to stop sample machining.

In the fourth exemplary embodiment of the second group of steps, the second group of steps comprises a sequence of steps performed by the evaluation unit comprising steps of: transforming stored discrete values, resetting part of transformed discrete values, creating filtered signal, averaging of filtered signal, detecting number of peaks, skipping close peaks, issuing command to stop sample machining.

In the fifth exemplary embodiment of the second group of steps, the second group of steps comprises a sequence of steps performed by the evaluation unit comprising steps of: transforming stored discrete values, resetting part of transformed discrete values, creating filtered signal, averaging of filtered signal, detecting the number of peaks, skipping close peaks, issuing a command to stop sample machining.

In the sixth exemplary embodiment of the second group of steps the second group of steps comprises a sequence of steps performed by the evaluation unit comprising steps:

transforming stored discrete values, resetting part of transformed discrete values, creating a filtered signal, averaging of filtered signal, detecting number of peaks, skipping close peaks, skipping the last peak, issuing command to stop sample machining.

In the first exemplary embodiment of the step of transforming stored discrete values, the stored discrete values are transformed according to frequencies into a part with high frequencies and into a part with the remaining frequencies by performing one-level discrete wavelet transformation of stored discrete values based on decomposition filters of the mother wavelet Daubechies-4. In the second exemplary embodiment of the step of transforming stored discrete values, the stored discrete values are transformed according to frequencies into a part with high frequencies into a part with medium high frequencies, into a part with medium low frequencies, and into a part with low frequencies by performing four-level discrete wavelet transformation of stored discrete values based on decomposition filters of the mother wavelet Daubechies-4.

In the first exemplary embodiment of the step of resetting part of transformed discrete values, the parts of transformed discrete values with high frequencies are reset. In the second exemplary embodiment of the step of resetting part of the transformed discrete values, the parts of the transformed values with high frequencies, with medium high frequencies, and with medium low frequencies are reset. Resetting part of transformed values is always just mere resetting of these values, these values are thus not removed, but the final signal is not affected anymore, in this case in the following step of created filtered signal.

The individual exemplary embodiments of the step of transforming stored discrete values and the step of resetting part of the transformed discrete values can be combined. Particularly, it is possible to combine the first exemplary embodiment of the step of transforming stored discrete values with the first exemplary embodiment of the step of resetting part of the transformed discrete values. Furthermore, it is also possible to combine the second exemplary embodiment of the step of transforming stored discrete values with the second exemplary embodiment of the step of resetting part of transformed discrete values. Furthermore, it is also possible to combine the second exemplary embodiment of the step of transforming stored discrete values with the first exemplary embodiment of the step of resetting part of transformed discrete values.

In the step of creating the filtered signal, the filtered signal is created by performing an inverse discrete wavelet transformation of transformed discrete values based on reconstruction filters of the mother wavelet Daubechies-4. The inputs for individual levels of the inverse discrete wavelet transformation are corresponding outputs of the individual levels of the discrete wavelet transformation.

In the step of detecting the number of peaks, the number of peaks of the filtered signal is detected by the peak nature defined in the memory. The peaks are detected by means of a first derivative approximation. In other words, the peaks are calculated as a difference between two adjacent values of the filtered signal, i.e. d(i)=x(i+1)−x(i), where x(i) stands for the filtered signal value and x(i+1) stands for the following filtered signal value, and if the value d(i) in two consecutive values exceeds zero, in other words, its plus/minus sign changes in relation to the previous value, the value in spot d(i) is marked as a peak.

In the step of issuing a command to stop sample machining, the command to stop sample machining by the focused ion beam is issued after a given number of peaks based on the information of the required number of peaks stored in the memory has been reached.

In the step of averaging the filtered signal, the filtered signal values are averaged with the use of a floating window, wherein the filtered signal values located in this window are averaged. The floating window is a gradually moving section of discrete values of the filtered signal. With growing number of discreet values, the floating window extends so that the maximum length of the floating window is in the range of 3% to 15% of the length of the filtered signal, but no longer than 50 discrete values. Averaging of values in this floating window is based on the formula $$y[i] = \frac{1}{Z}\sum_{j=0}^{Z-1} x[i+j],$$

where x [ ] are the original values of the filtered signal, y [ ] are averaged values of the filtered signal and Z is the number of discrete values in the floating window.

In the step of skipping close peaks, the skipped peaks are those with distance from the closest peak lower than 50% of the average distance value between consecutive peaks.

In the step of skipping the last peak, the last peak is skipped. The step of skipping the last peak is applied in case of a noisy signal to which the step of averaging of the filtered signal was applied.

Figure 2:
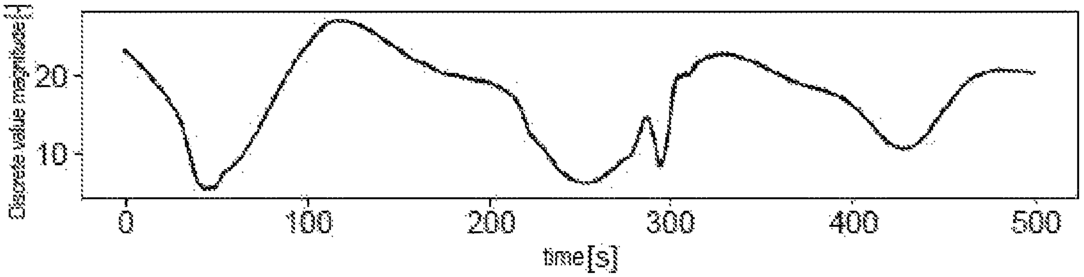
FIG. 2 shows a graph showing the magnitude of stored discrete values of the filtered signal of the first specific exemplary embodiment in relation to time.
Figure 3:
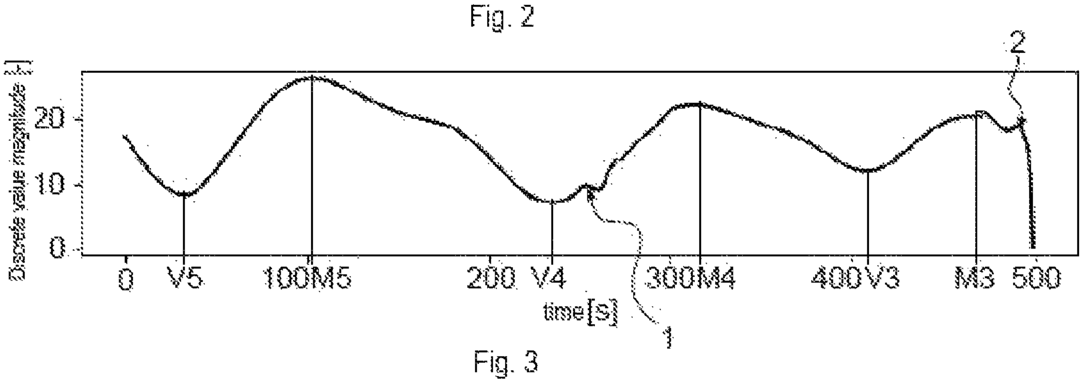
FIG. 3 shows a graph showing the magnitude of stored discrete values of the averaged filtered signal of the first specific exemplary embodiment in relation to time.

FIGS. 1, 2, 3 show the first specific exemplary embodiment of the present invention, in which the machined sample is a multilayer semiconductor chip, wherein the initial layer is layer V5 and the last layer to be milled during the sample machining by the focused ion beam is layer M3. Therefore, information that the required number of peaks is three and that these peaks are local maxima in this exemplary embodiment is stored in the memory. The multilayer semiconductor chip is first placed in the sample holder. Subsequently, the step of the first group of steps is repeatedly performed, irradiating individual machined spots of the multilayer semiconductor chip by the focused ion beam and detecting the amount of secondary particles emitted from the machined multilayer semiconductor chip, which is impinged by the focused ion beam, and storing discrete values obtained by averaging the detected amount of secondary particles from the machined multilayer semiconductor chip with the sampling frequency of 2 Hz in the memory. The graph in FIG. 1 shows the stored discrete values, wherein it is obvious from the graph that the signal contains higher number of local maxima than the required number of local maxima, therefore, the signal is considered noisy. In addition, the steps of second group of steps are repeatedly performed until the required number of local maxima is recorded, wherein FIGS. 1, 2 and 3 show the final state when the machining is stopped. In this exemplary embodiment the second group of steps comprises a sequence of steps of: transforming stored discrete values, resetting part of transformed discrete values, creating filtered signal, averaging of filtered signal, detecting number of peaks, skipping close peaks, skipping the last peak, using command to stop sample machining. In the step of transforming stored discrete values, the stored discrete values are transformed according to frequencies into a part with high frequencies, into a part with medium high frequencies, into a part with medium low frequencies, and into a part with low frequencies by performing four-level discrete wavelet transformation of stored discrete values based on decomposition filters of the mother wavelet Daubechies- 4. In the step of resetting part of transformed discrete values, the part of transformed values with high frequencies, with medium high frequencies, and with medium low frequencies is reset. In the step of creating filtered signal, the filtered signal is created by performing four-level inverse discrete wavelet transformation of transformed discrete values based on reconstruction filters of the mother wavelet Daubechies-4. The filtered signal created in this way is shown in graph in FIG. 2. In the following step of averaging the filtered signal, the filtered signal values are averaged with the use of a floating window, wherein the filtered signal values located in this window are averaged. The maximum length of the floating window in this exemplary embodiment is 10% of the length of the filtered signal and at the same time the maximum length corresponds to the maximum of 50 discrete values. The filtered signal averaged in this way is shown in graph in FIG. 3. In the step of detecting the number of peaks, the number of local maxima is detected. In the step of skipping close peaks, the local maximum 1 is skipped, since its distance from the following local maximum is lower than 50% of the average distance value between consecutive local maxima, thus being a false local maximum. In the step of skipping the last peak, the last local maximum 2 is skipped, since it is a false local maximum generated due to the borderline phenomenon after averaging of the filtered signal has been performed. Subsequently, the step of issuing a command to stop sample machining is performed, since the required three local maxima were recorded. This information is then transferred from the evaluation unit to the control unit, and the step of stopping the irradiation of the individual machined spots of the multilayer semiconductor chip by the focused ion beam is performed.

Figure 4:
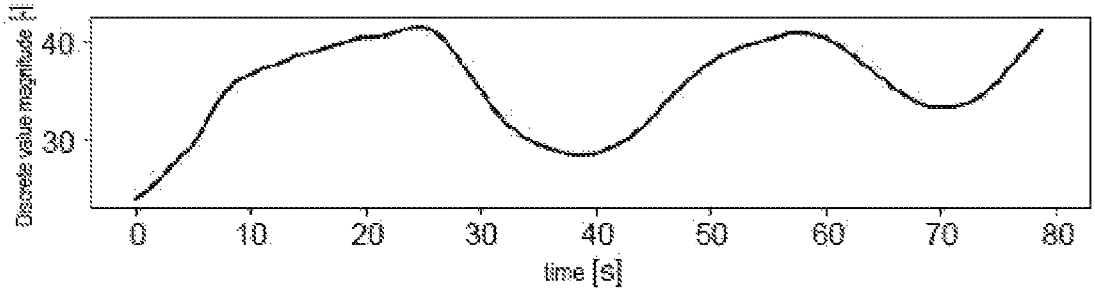
FIG. 4 shows a graph showing the magnitude of stored discrete values of the second specific exemplary embodiment in relation to time.
Figure 5:
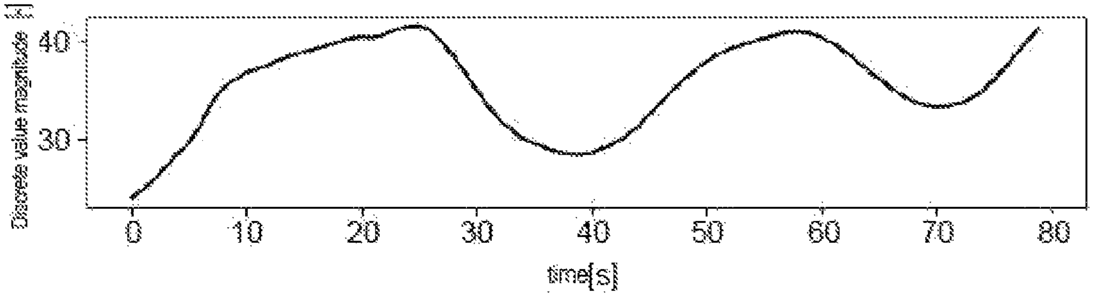
FIG. 5 shows a graph showing the magnitude of stored discrete values of the filtered signal of the second specific exemplary embodiment in relation to time.
Figure 6:
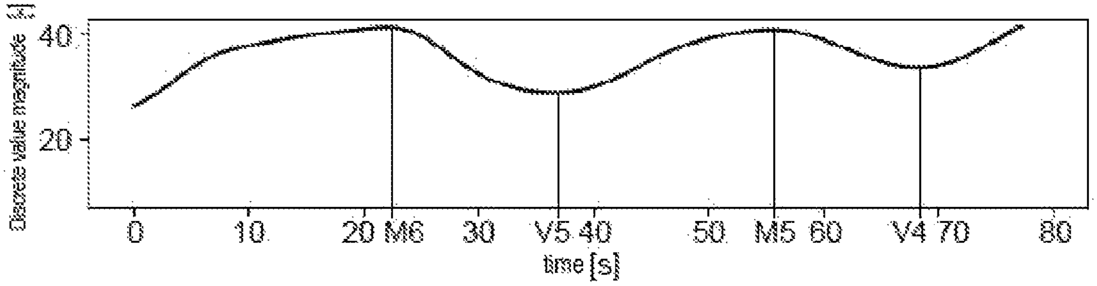
FIG. 6 shows a graph showing the magnitude of stored discrete values of the averaged filtered signal of the second specific exemplary embodiment in relation to time.

FIGS. 4, 5, 6 the second specific exemplary embodiment of the present invention, in which the machined sample is a multilayer semiconductor chip, wherein the initial layer is layer M6 and the last layer to be milled during the sample machining by the focused ion beam is layer V4. Therefore, information that the required number of peaks is two and that these peaks are local minima in this exemplary embodiment is stored in the memory. The multilayer semiconductor chip is first placed in the sample holder. Subsequently, the step of the first group of steps is repeatedly performed, irradiating individual machined spots of the multilayer semiconductor chip by the focused ion beam and detecting the amount of secondary particles emitted from the machined multilayer semiconductor chip, which is impinged by the focused ion beam, and storing discrete values obtained by averaging the detected amount of secondary particles from the machined multilayer semiconductor chip with the sampling frequency of 2 Hz in the memory. The graph in FIG. 4 shows the stored discrete values, wherein it is obvious from the graph that the signal does not contain higher number of local minima than the required number of local minima, therefore, the signal is not considered noisy. In addition, the steps of second group of steps are repeatedly performed until the required number of local minima is recorded, wherein FIGS. 4, 5 and 6 show the final state when the machining is stopped. In this exemplary embodiment the second group of steps comprises a sequence of steps of: transforming stored discrete values, resetting part of transformed discrete values, creating filtered signal, averaging of filtered signal, detecting number of peaks, and issuing command to stop sample machining. In the step of transforming stored discrete values, the stored discrete values are transformed according to the frequencies into a part with high frequencies, and into a part with the remaining frequencies by performing one-level discrete wavelet transformation of the stored discrete values based on decomposition filters of the mother wavelet Daubechies-4. In the step of resetting part of transformed discrete values, the part of transformed discrete values with high frequencies is reset. In the step of creating a filtered signal, the filtered signal is created by performing one-level inverse discrete wavelet transformation of transformed discrete values based on reconstruction filters of the mother wavelet Daubechies-4. The filtered signal created in such a way is shown in graph in FIG. 5. In the following step of averaging the filtered signal, the filtered signal values are averaged with the use of a floating window, wherein the filtered signal values located in this window are averaged. The maximum length of the floating window in this exemplary embodiment is 5% of the length of the filtered signal and at the same time the maximum length corresponds to the maximum of 10 discrete values. The filtered signal averaged in such a way is shown in graph in FIG. 6. In the step of detecting the number of peaks, the number of local minima is detected. Subsequently, the step of issuing a command to stop sample machining is performed, since the required two local minima were recorded. This information is then transferred from the evaluation unit to the control unit, and the step of stopping the irradiation of the individual machined spots of the multilayer semiconductor chip by the focused ion beam is performed.

LIST OF REFERENCE NUMERALS

1—local maximum
2—last local maximum

The invention claimed is:

1. A method of automatic detection of a required peak for sample machining by a focused ion beam by means of a system comprising an ion column with an ion source arranged for irradiating a sample by the focused ion beam, a working chamber, to which the ion column is connected, a detector of secondary particles, which is located in the working chamber or in the ion column, a sample holder located in the working chamber and arranged for accommodating a sample, a sample located in the sample holder, and an evaluation unit comprising a memory which stores at least information on the required number of peaks, comprising a first group of steps comprising a steps of:

a) irradiating individual machined spots in a machined area of the sample by the focused ion beam and
b) detecting a quantity of secondary particles emitted from the machined area, and
c) storing discrete values obtained by averaging of the detected quantity of secondary particles from the whole machined area with a sampling frequency in a range of 1 to 3 Hz to the memory, and a second group of steps performed simultaneously with the first group of steps, wherein the second group of steps is performed by the evaluation unit, and wherein the second group of steps comprises a sequence of steps of:

d) transforming the stored discrete values according to frequencies at least to a part with high frequencies and to a part with remaining frequencies by performing at least one-level discrete wavelet transformation of the stored discrete values based on decomposition filters of a mother wavelet,
e) resetting part of transformed discrete values with high frequencies, f) creating a filtered signal by performing an inverse discrete wavelet transformation of transformed discrete values based on reconstruction filters of the mother wavelet, g) detecting the number of filtered signal peaks, and h) issuing a command to stop sample machining by the focused ion beam after reaching a given number of peaks based on the information on the required number of peaks.

2. The method of automatic detection of the required peak for sample machining by the focused ion beam according to claim 1, wherein in the step of transforming stored discrete values, the stored discrete values are separated at least to the part with the high frequencies, to a part with medium high frequencies, to a part with medium low frequencies, and to a part with low frequencies, forming the remaining frequencies, by performing four-level discrete wavelet transformation of the stored discrete values based on decomposition filters of the mother wavelet.

3. The method of automatic detection of the required peak for sample machining by the focused ion beam according to claim 2, wherein in the step of resetting part of transformed discrete values, the parts of transformed discrete values with high frequencies, with medium high frequencies, and with medium low frequencies are reset.

4. The method of automatic detection of the required peak for sample machining by the focused ion beam according to claim 1, wherein after the step of creating a filtered signal and before the step of detecting the number of peaks, a step of averaging the filtered signal with the use of a floating window and averaging a magnitude of values of the filtered signal located in this floating window is further performed by the evaluating unit.

5. The method of automatic detection of the required peak for sample machining by the focused ion beam according to claim 4, wherein a floating window length corresponds to a number of detected discrete values up to a maximum floating window length corresponding to 3 to 15% of a current number of detected discrete values, however, up to the maximum floating window length corresponding to the maximum number of 100 discrete values.

6. The method of automatic detection of the required peak for sample machining by the focused ion beam according to claim 1, wherein after the step of detecting the number of peaks and before the step of issuing a command to stop sample machining, a step of skipping close peaks is further performed by the evaluating unit, wherein the close peaks are peaks with a distance from a closest peak smaller than 50% of an average distance value between individual consecutive peaks.

7. The method of automatic detection of the required peak for sample machining by the focused ion beam according to claim 1, wherein after the step of detecting the number of peaks of the filtered signal and before the step of issuing a command to stop sample machining by the focused ion beam, a step of skipping a last peak is performed by the evaluating unit.

8. The method of automatic detection of the required peak for sample machining by the focused ion beam according to claim 7, wherein peaks are local a maxima of the filtered signal.

9. The method of automatic detection of the required peak for sample machining by the focused ion beam according to claim 1, wherein peaks are a local minima of the filtered signal.

10. The method of automatic detection of the required peak for sample machining by the focused ion beam according to claim 1, wherein the mother wavelet is Daubechies-4.

* * * * *